(12) United States Patent
Hsieh et al.

(10) Patent No.: US 11,704,929 B2
(45) Date of Patent: Jul. 18, 2023

(54) OPTICAL STRUCTURE AND METHOD OF FABRICATING THE SAME

(71) Applicant: VisEra Technologies Company Limited, Hsin-Chu (TW)

(72) Inventors: Chin-Chuan Hsieh, Hsin-Chu (TW); Yueh-Ching Cheng, Hsinchu (TW); Shih-Yu Ho, Hsinchu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 390 days.

(21) Appl. No.: 16/920,985

(22) Filed: Jul. 6, 2020

(65) Prior Publication Data

US 2022/0004732 A1 Jan. 6, 2022

(51) Int. Cl.
| | |
|---|---|
| *G06V 40/13* | (2022.01) |
| *B29D 11/00* | (2006.01) |
| *H01L 27/146* | (2006.01) |
| *G02B 5/18* | (2006.01) |
| *G02B 19/00* | (2006.01) |

(52) U.S. Cl.
CPC ...... *G06V 40/1318* (2022.01); *B29D 11/0073* (2013.01); *G02B 5/1809* (2013.01); *G02B 19/0076* (2013.01); *H01L 27/14643* (2013.01)

(58) Field of Classification Search
CPC ............ G06V 40/1318; B29D 11/0073; G02B 5/1809; G02B 19/0076; H01L 27/14643
See application file for complete search history.

(56) References Cited

U.S. PATENT DOCUMENTS

| | | | |
|---|---|---|---|
| 7,126,553 | B1 * | 10/2006 | Fink ..................... H01Q 19/30 343/915 |
| 2008/0316323 | A1 * | 12/2008 | Morita ............... G06V 40/1318 348/222.1 |
| 2017/0131460 | A1 | 5/2017 | Lin et al. |
| 2018/0241131 | A1 * | 8/2018 | Akselrod ................. H01Q 3/44 |
| 2018/0248267 | A1 | 8/2018 | Akselrod |

FOREIGN PATENT DOCUMENTS

| | | |
|---|---|---|
| JP | 2015092234 A | 5/2015 |
| JP | 2018156999 A | 10/2018 |
| JP | 2021506168 A | 2/2021 |
| TW | 201140149 A | 11/2011 |
| TW | 201303401 A | 1/2013 |
| TW | 201728931 A | 8/2017 |
| TW | 201909439 A | 3/2019 |
| TW | 202040168 A | 11/2020 |
| WO | WO-2019/109182 A1 | 6/2019 |

OTHER PUBLICATIONS

Office Action dated Jan. 24, 2022 in TW Application No. 1101039305, 11 pages.
Partial Search Report issued in corresponding EP application No. 20193280.3 dated Feb. 17, 2021 (12 pages).

* cited by examiner

*Primary Examiner* — Georgia Y Epps
*Assistant Examiner* — Don J Williams
(74) *Attorney, Agent, or Firm* — Muncy, Geissler, Olds & Lowe, P.C.

(57) ABSTRACT

An optical structure is provided. The optical structure includes an optical element and a plurality of protrusions. The optical element has a planarized top surface. The plurality of protrusions are disposed on the planarized top surface, wherein each of the plurality of protrusions independently has a size in the subwavelength dimensions.

16 Claims, 18 Drawing Sheets

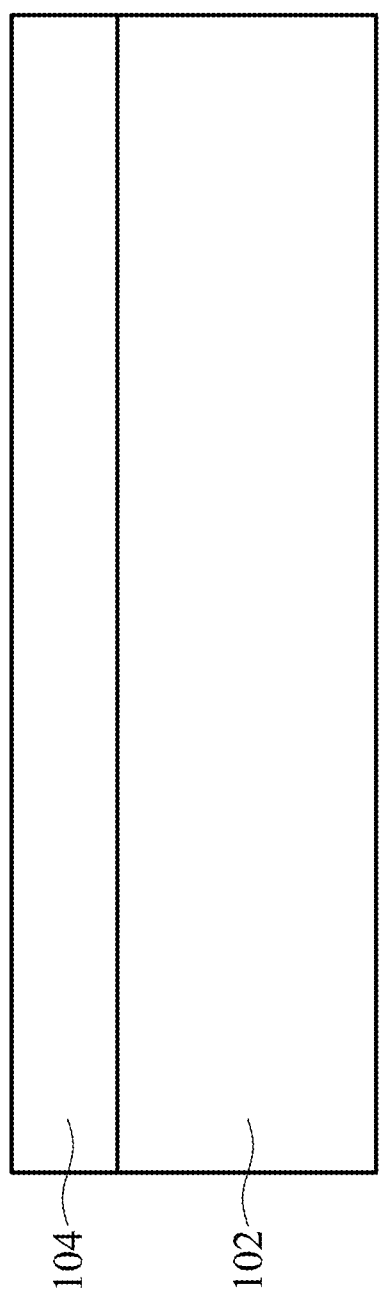

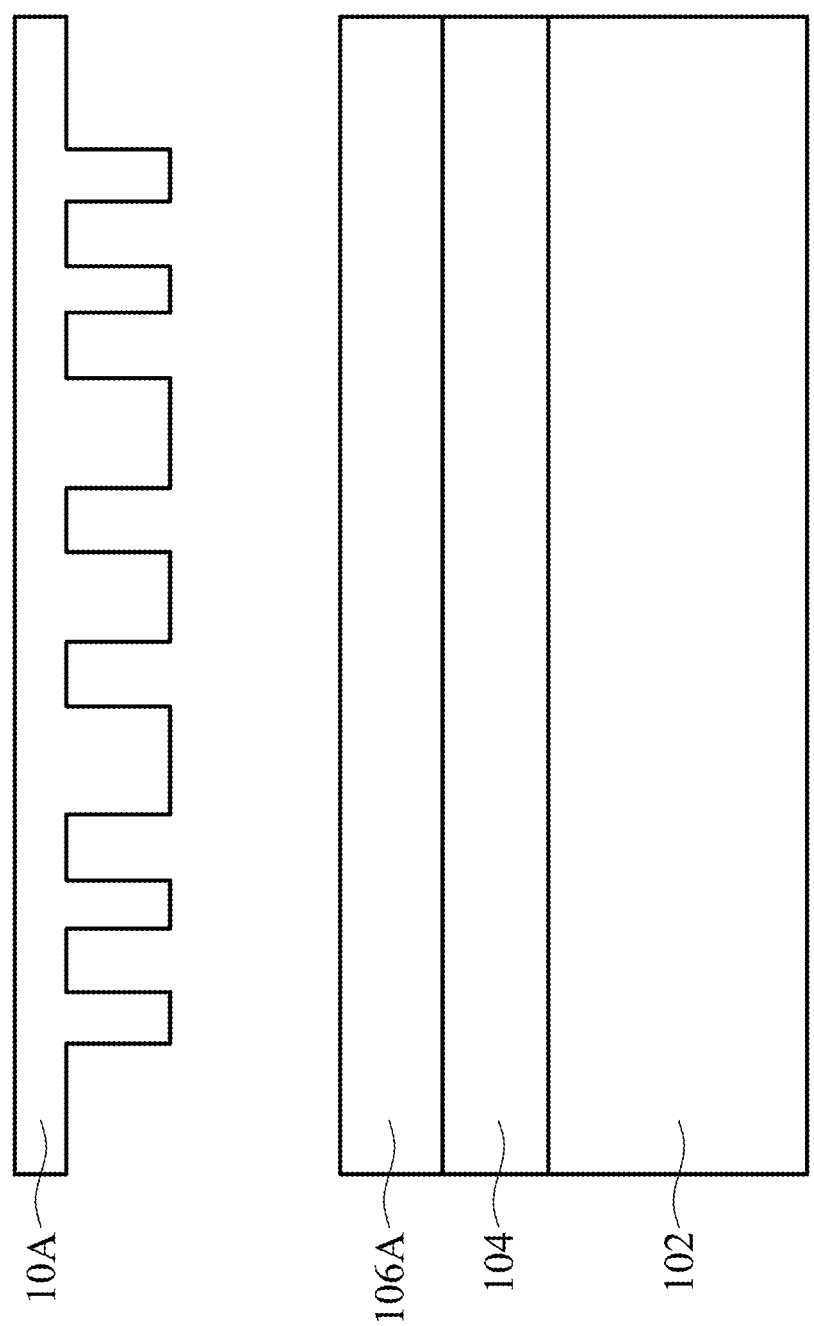

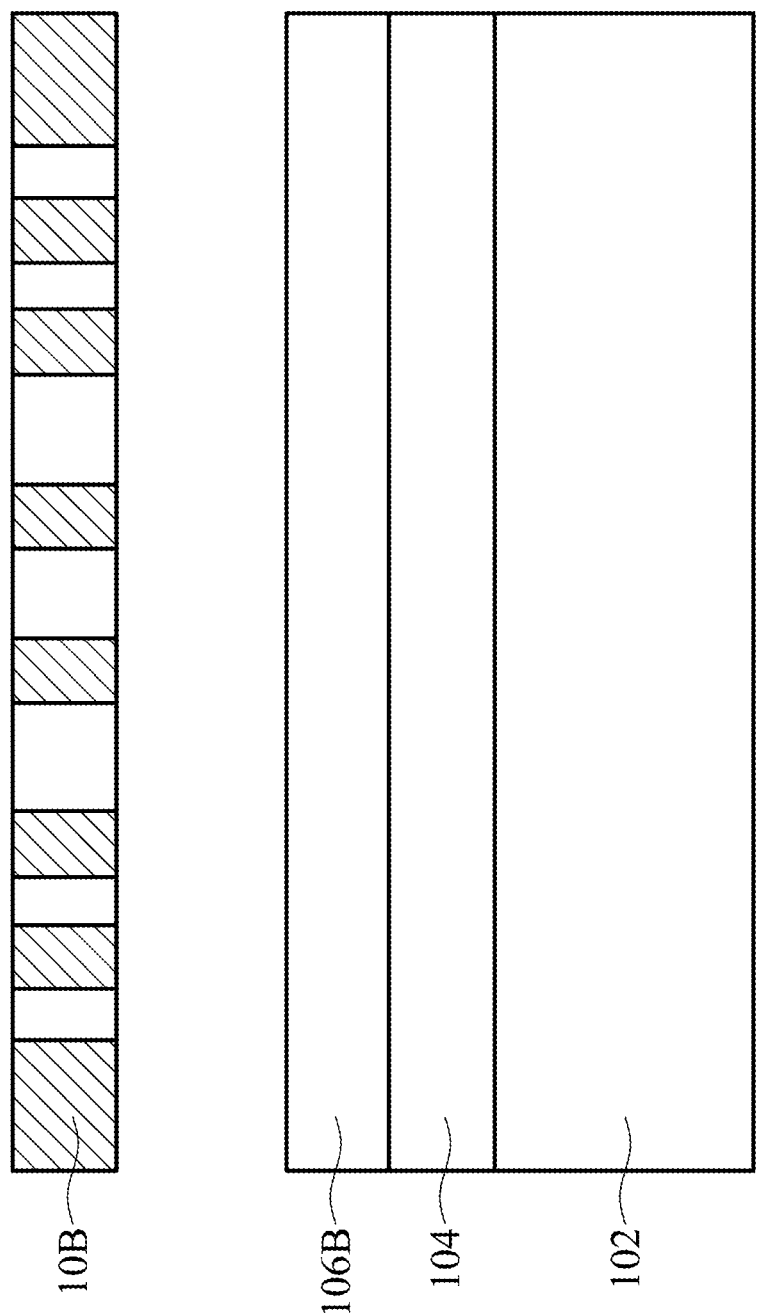

US 11,704,929 B2

OPTICAL STRUCTURE AND METHOD OF FABRICATING THE SAME

BACKGROUND OF THE INVENTION

Field of the Invention

The present invention relates to an optical structure, and, in particular, it relates to an optical structure having a metasurface.

Description of the Related Art

Various optical devices, such as complementary metal oxide semiconductor (CMOS) image sensors and optical fingerprint devices, have been developed. However, some issues may occur when the light source consists of stray light. For example, the CMOS image sensors may experience crosstalk, which can degrade the spatial resolution, reduce the overall sensitivity, and cause color-mixing, which can lead to image errors. If an optical multifilm is used in an optical device, the optical multifilm may experience blue shift due to stray light irradiating the optical multifilm at a large angle, resulting in the wavelength of the stray light shifting toward blue light. In addition, the optical fingerprint device may produce lower-resolution images with lower contrast using stray light.

Although existing optical devices have been adequate for their intended purposes, they have not been satisfactory in every respect. As a result, there is a need for a novel optical structure that can solve the aforementioned issues.

BRIEF SUMMARY OF THE INVENTION

The present invention provides an optical structure that can collimate stray light. A metasurface is disposed on a planarized surface. The metasurface includes a pattern which has a plurality of protrusions. The metasurface can collimate the stray light when the stray light passes the metasurface. Therefore, the stray light irradiates the optical device at an incident angle of 0 degrees. As a result, crosstalk in the CMOS image sensor may be avoided, thereby enhancing spatial resolution, enhancing overall sensitivity and avoiding color-mixing, which leads to better image quality. The blue-shift issue can also be addressed because the optical multifilm is not irradiated at a large angle. The optical fingerprint devices can also produce higher-resolution images at a higher contrast.

An optical structure is provided in accordance with some embodiments of the present invention. The optical structure includes an optical element and a plurality of protrusions. The optical element has a planarized top surface. The plurality of protrusions are disposed on the planarized top surface, wherein each of the plurality of protrusions independently has a size in the subwavelength dimensions.

A method of fabricating an optical structure is provided in accordance with some embodiments of the present invention. The method includes: providing an optical element having a planarized top surface; and forming a plurality of protrusions on the planarized top surface, wherein each of the plurality of protrusions independently has a size in the subwavelength dimensions.

An optical system is provided in accordance with some embodiments of the present invention. The optical system includes a sensing sensor, an optical element and a plurality of protrusions. The optical element is disposed above the sensing sensor. The optical element has a planarized top surface. The plurality of protrusions are disposed on the planarized top surface, wherein each of the plurality of protrusions independently has a size in subwavelength dimensions.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2 illustrates a cross-sectional view of fabricating an optical structure at one stage in accordance with some embodiments.

FIG. 4A illustrates a cross-sectional view of fabricating an optical structure at one stage in accordance with some embodiments.

FIG. 4B illustrates a cross-sectional view of fabricating an optical structure at one stage in accordance with other embodiments.

DETAILED DESCRIPTION OF THE INVENTION

Figure 1:
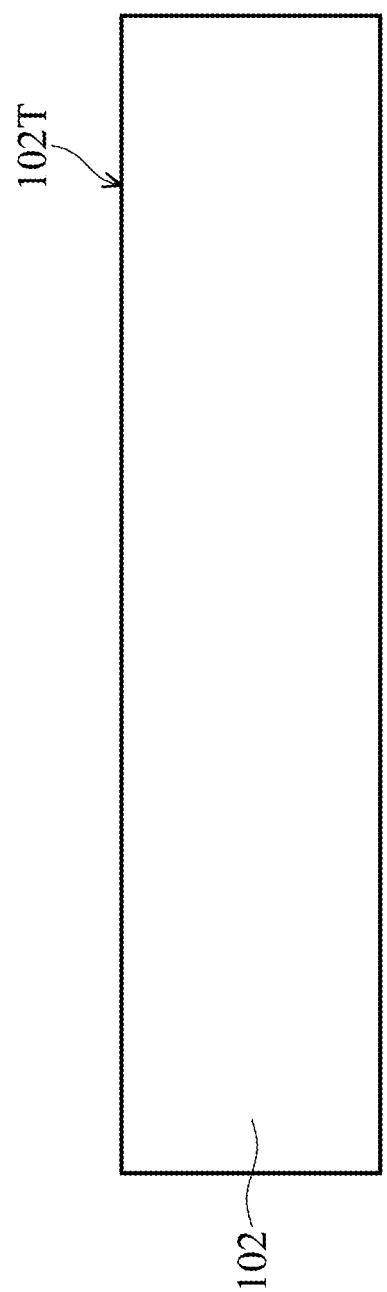
FIG. 1 illustrates a cross-sectional view of fabricating an optical structure at one stage in accordance with some embodiments.

The optical structure of the present invention is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed as referring to the orientation as described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

Herein, the terms "about", "around" and "substantially" typically mean +/−20% of the stated value or range, typically +/−10% of the stated value or range, typically +/−5% of the stated value or range, typically +/−3% of the stated value or range, typically +/−2% of the stated value or range, typically +/−1% of the stated value or range, and typically +/−0.5% of the stated value or range. The stated value of the present disclosure is an approximate value. Namely, the meaning of "about", "around" and "substantially" may be implied if there is no specific description of "about", "around" and "substantially".

FIGS. 1, 2, 3A, 3B, 4A, 4B, 5A, 5B and 6 are cross-sectional views illustrating various stage of fabricating an optical structure 100 in accordance with some embodiments. Referring to FIG. 1, an optical element 102 is provided. As shown in FIG. 1, the optical element 102 has a planarized top surface 102T. In some embodiments, the optical element 102 further includes an optical multifilm.

Next, referring to FIG. 2, a material layer 104 is formed on the planarized top surface 102T. To be specific, the material layer 104 may be formed on the planarized top surface 102T by using sputtering, spin-coating, chemical vapor deposition (CVD), low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), physical vapor deposition process, molecular beam deposition process, any other suitable process or a combination thereof. The material of the material layer 104 includes a dielectric material, such as $TiO_2$, SiN, $SiO_2$, SiH or a combination thereof.

Figure 3A:
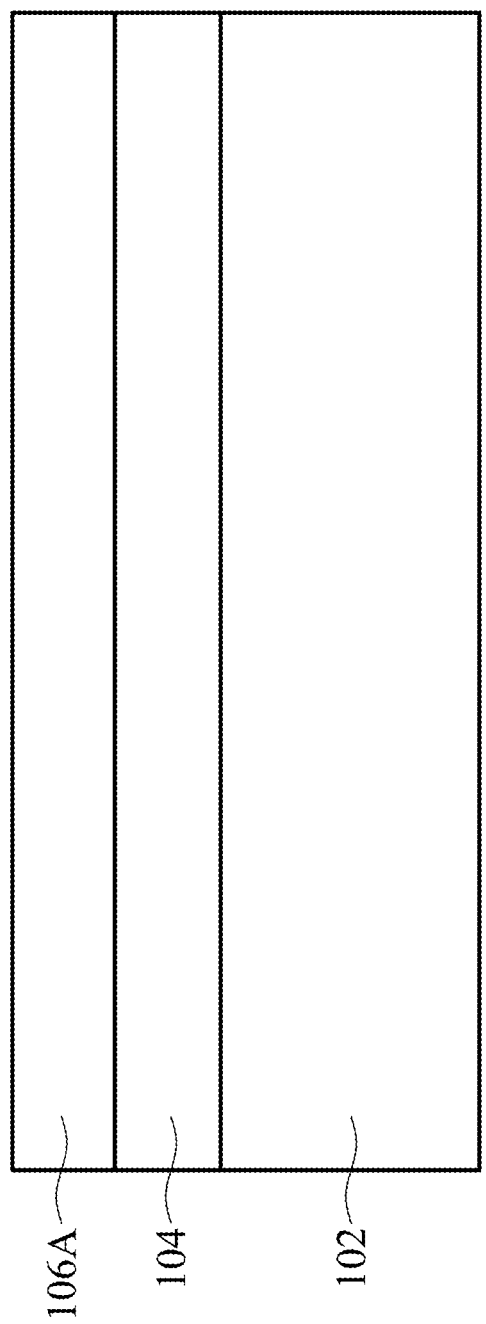
FIG. 3A illustrates a cross-sectional view of fabricating an optical structure at one stage in accordance with some embodiments.
Figure 5A:
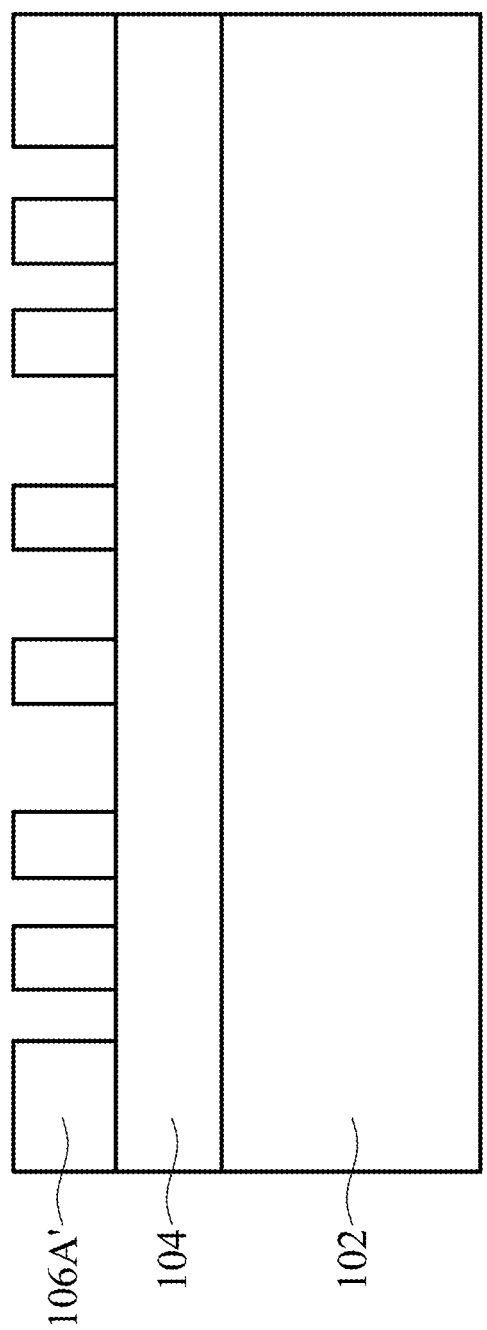
FIG. 5A illustrates a cross-sectional view of fabricating an optical structure at one stage in accordance with some embodiments.

Next, the material layer 104 is patterned to form a plurality of protrusions 104' by nanoimprint lithography. FIGS. 3A, 4A and 5A illustrate various stage of fabricating an optical structure 100 in accordance with some embodiments. A resin layer 106A is formed on the material layer 104 as shown in FIG. 3A. To be specific, the resin layer 106A may be formed on the material layer 104 by using sputtering, spin-coating, chemical vapor deposition (CVD), low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), physical vapor deposition process, molecular beam deposition process, any other suitable process or a combination thereof.

In some embodiments, the material of the resin layer 106A includes a thermoplastic polymer or a UV curable resin. The thermoplastic polymer may include polyethylene (PE), polypropylene (PP), polystyrene (PS), polymethylmethacrylate (PMMA), polyvinyl chloride (PVC), Nylon, polycarbonate (PC), polyurethane (PU), polytetrafluoroethylene (PTFE, also known as Teflon), polyethylene terephthalate (PET) or a combination thereof. The UV curable resin may include epoxy acrylate, acrylated polyester, acrylated urethane, acrylated silicone or a combination thereof.

Next, referring to FIG. 4A, a mold 10A with a pattern is applied to the resin layer 106A. Then, the resin layer 106A is cured by heat or UV light depending on the material of the resin layer 106A.

Figure 6:
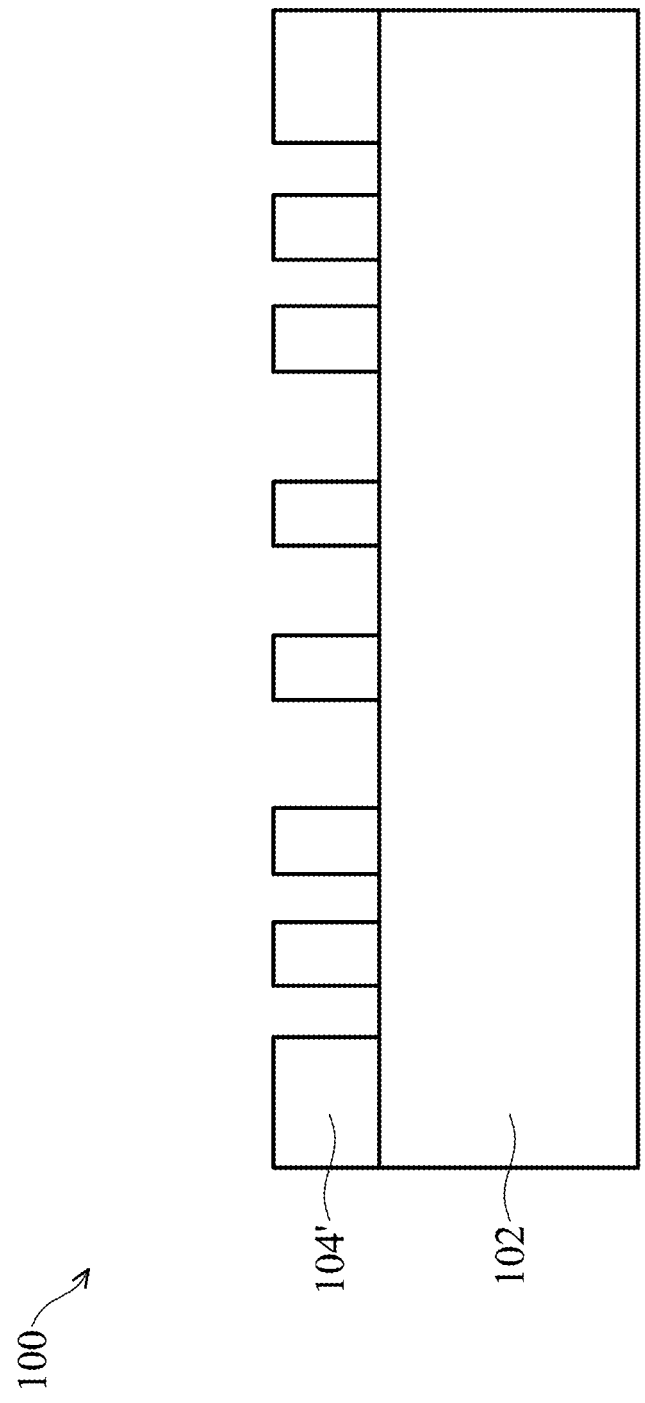
FIG. 6 illustrates a cross-sectional view of fabricating an optical structure at one stage in accordance with some embodiments.

Next, referring to FIG. 5A, the mold 10A is removed and a patterned resin layer 106A' is formed. The patterned resin layer 106A' serves as an etching mask for etching. Next, the material layer 104 may be etched using a suitable etchant by reactive ion etching, neutral beam etching or the like. Then, a plurality of protrusions 104A' corresponding to the pattern of the mold 10A is formed on the planarized top surface 102T of the optical element 102, as shown in FIG. 6. Therefore, the metasurface is complete. The nanoimprint process can have a higher process throughput.

Figure 3B:
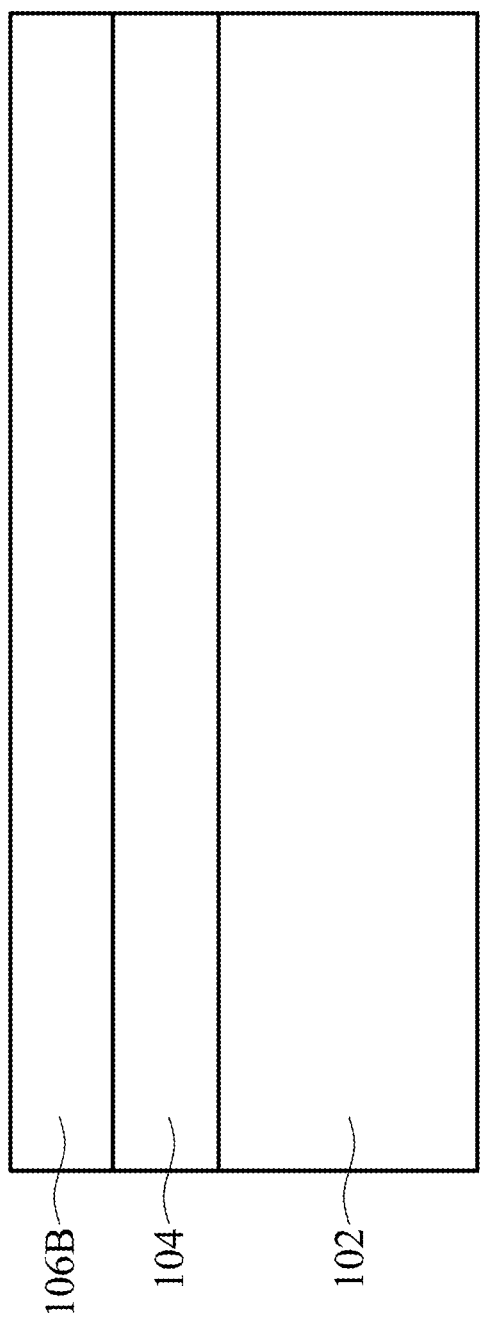
FIG. 3B illustrates a cross-sectional view of fabricating an optical structure at one stage in accordance with other embodiments.
Figure 5B:
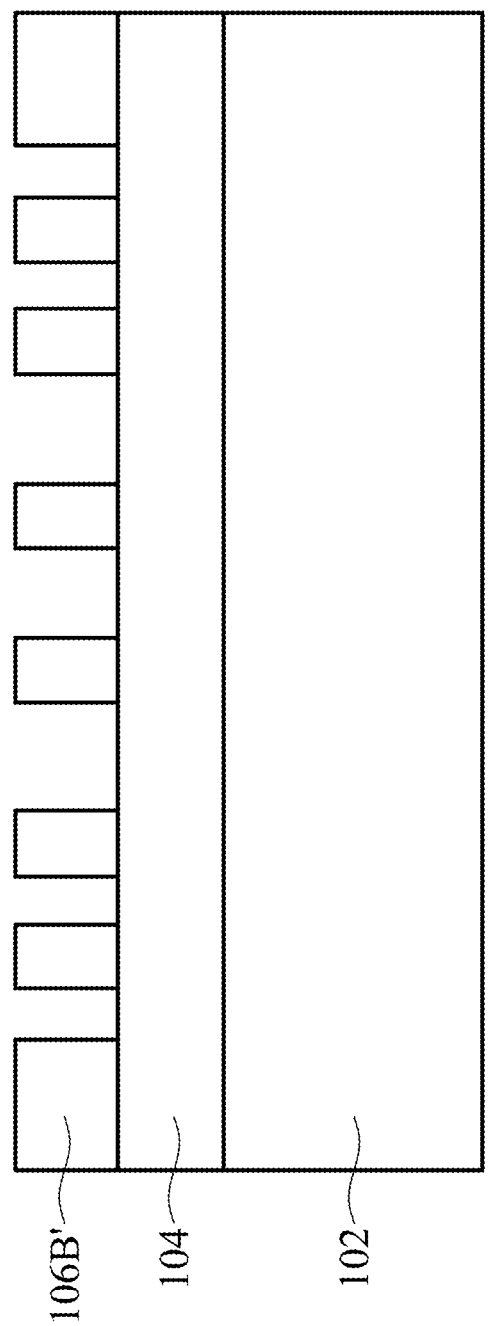
FIG. 5B illustrates a cross-sectional view of fabricating an optical structure at one stage in accordance with other embodiments.

Alternatively, the material layer 104 may also be patterned to form a plurality of protrusions 104' by lithography. FIGS. 3B, 4B and 5B illustrate various stage of fabricating an optical structure 100 in accordance with other embodiments. A photoresist layer 106B is formed on the material layer 104 as shown in FIG. 3B. To be specific, the photoresist layer 106B is formed on the material layer 104 by sputtering, spin-coating, chemical vapor deposition, low-pressure chemical vapor deposition, low-temperature chemical vapor deposition, rapid thermal chemical vapor deposition, plasma enhanced chemical vapor deposition, atomic layer deposition, physical vapor deposition process, molecular beam deposition process, any other suitable process or a combination thereof.

The photoresist layer 106B includes a photoresist material sensitive to a radiation source. The photoresist material may be a positive-tone or negative-tone resist material and the photoresist layer 106B may have a multi-layer structure. Furthermore, the photoresist layer 106B may be implemented with a chemical amplification (CA) resist material. In an embodiment, a positive-tone CA resist material includes a polymeric material that becomes soluble in a developer after the polymer is exposed to acidic moieties. Alternatively, a negative-tone CA resist material includes a polymeric material that becomes insoluble in a developer after the polymer is exposed to acidic moieties.

Next, referring to FIG. 4B, the photoresist layer 106B is exposed to a radiation source through a photomask 10B with a pattern. In some embodiments, the radiation source may be UV radiation (i-line), deep ultraviolet (DUV) radiation, and/or extreme ultraviolet (EUV) radiation.

Next, referring to FIG. 5B, post-exposure baking and development are performed to remove some photoresist layer 106B to form a patterned photoresist layer 106B'. The patterned photoresist layer 106B' serves as an etching mask for etching. Next, the material layer 104 may be etched using a suitable etchant by reactive ion etching, neutral beam etching or the like. Then, the plurality of protrusions 104' corresponding to the pattern of the photomask 10B is formed on the planarized top surface 102T of the optical element 102, as shown in FIG. 6. Therefore, the metasurface is complete. The optical structure can have high resolution patterning and have better process stability using lithography.

In the embodiments where the optical element 102 is disposed above a CMOS image sensor, crosstalk caused by stray light may be avoided by disposing a metasurface that has a plurality of protrusions. The metasurface may collimate stray light so that the collimated stray light will irradiate undesired regions thereby avoiding the crosstalk issue, enhancing spatial resolution, enhancing overall sensitivity, improving signal-to-noise ratio and avoiding color-mixing, which leads to better image quality. In addition, the isolation wall between the photodiodes can be omitted, thereby reducing the volume of the device.

In the embodiments where the optical element 102 further includes an optical multifilm, because the stray light is collimated by the metasurface, the optical multifilm is not irradiated at a large angle. As a result, the blue-shift issue can be addressed. Therefore, the metasurface can replace the blue glass that is used in the prior art to address the blue-shift issue.

In the embodiments wherein the optical element 102 is disposed above a fingerprint sensor, because the stray light is collimated by the metasurface, the fingerprint sensors can also produce higher-resolution images at a higher contrast.

The plurality of protrusions 104' may be cylinders, cubes, cuboids or V-shaped antennas. Each of the plurality of protrusions 104' may have a subwavelength dimension, which means the dimension of each of the plurality of protrusions 104' is smaller than the wavelength of an applied light source. The wavelength of the applied light source may be in the visible light or infrared light, such as 630, 850, 940, 1350, 1550 nm. Also, there is also a pitch between two adjacent protrusions 104'. It should be appreciated that the dimension of the protrusion and the pitch between two adjacent protrusions can control a phase of an incident light to be between 0 and $2\pi$. Furthermore, the plurality of protrusions 104' may be distributed (i.e. size distribution) to control a phase of an incident light to be between 0 and $2\pi$.

Figure 7A:
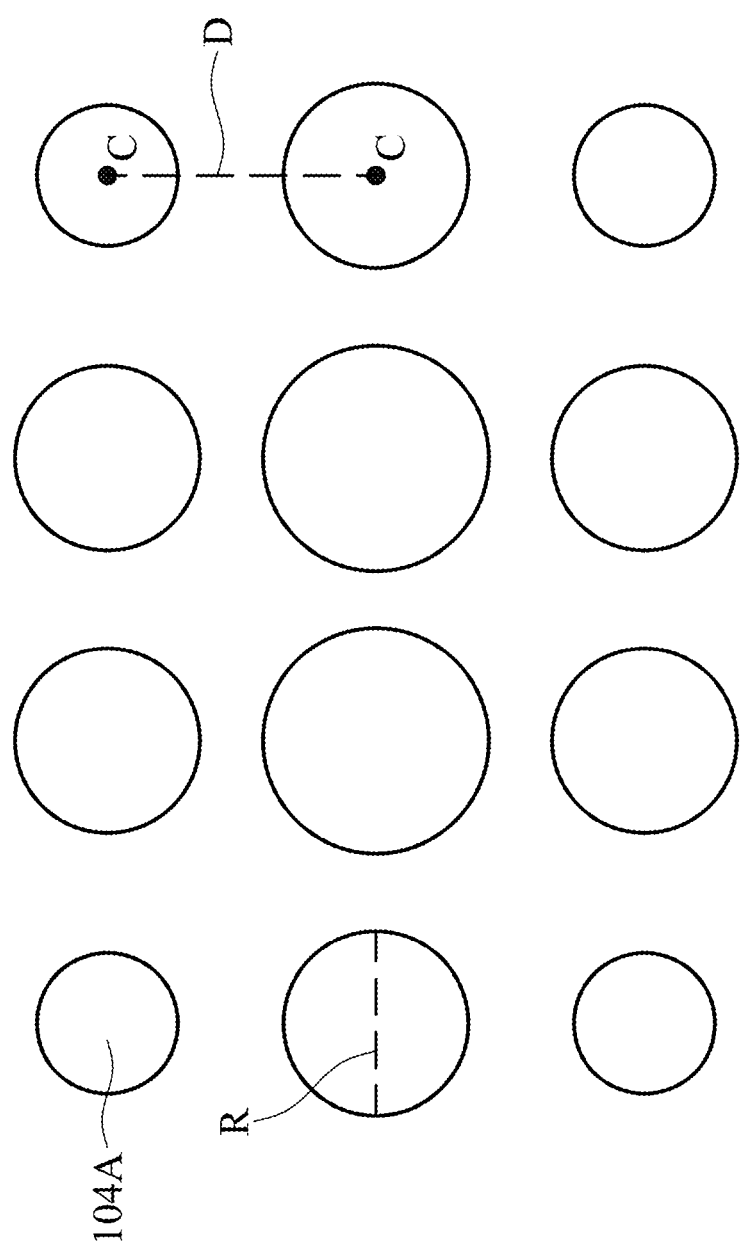
FIG. 7A illustrates a top view of a plurality of protrusions in accordance with some embodiments.

Referring to FIG. 7A, which illustrates a top view of a plurality of protrusions 104A in accordance with some embodiments, each of the plurality of protrusions 104A is a cylinder, which is a circle from a top view. Each of the plurality of protrusions 104A independently has a diameter R from a top view. The diameter R is a subwavelength dimension. In some embodiments, the diameter R may range from 40 nm to 500 nm. Each of the plurality of protrusions 104A independently has a center C from a top view. In this embodiment, the center C is a point inside the circle that is the same distance from each point on the circumference of the circle. There is a pitch D between two adjacent centers C. The pitch D may range from 100 nm to 1000 nm.

Figure 7B:
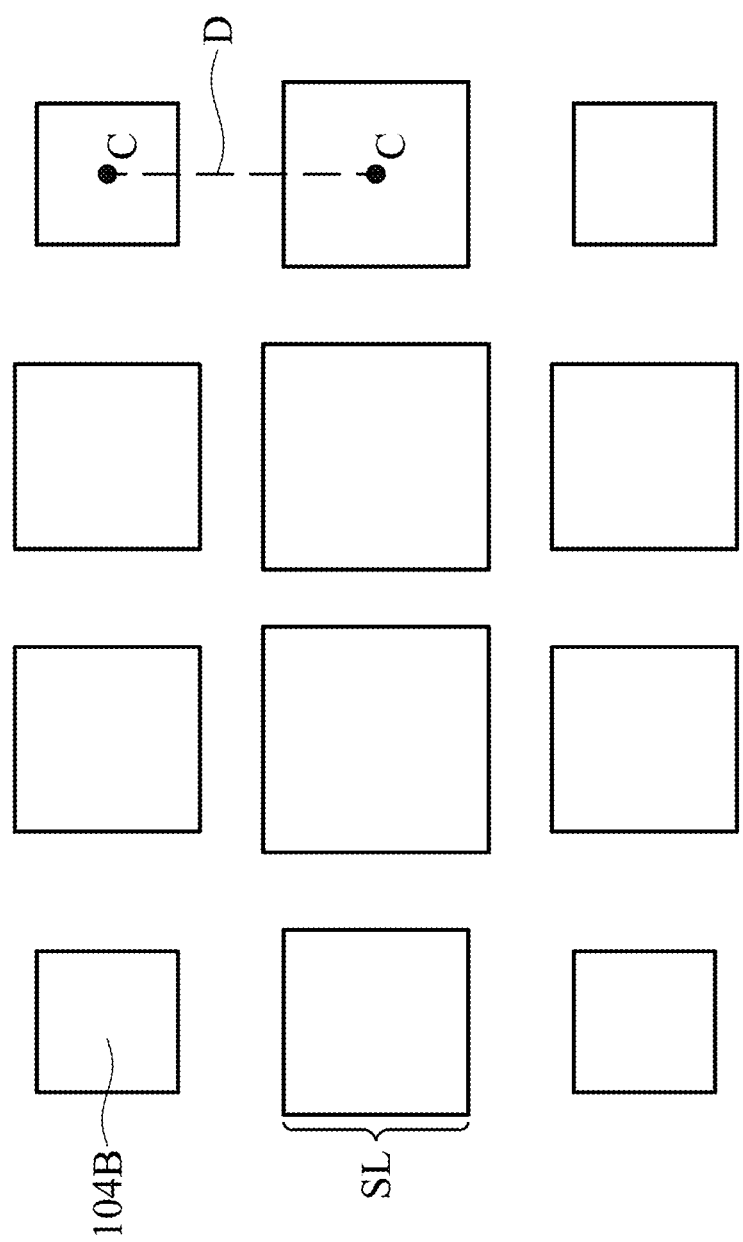
FIG. 7B illustrates a top view of a plurality of protrusions in accordance with some embodiments.

FIG. 7B, which illustrates a top view of a plurality of protrusions 104B in accordance with some embodiments, each of the plurality of protrusions 104B is a cube, which is a square from a top view. Each of the plurality of protrusions 104B independently has a side length SL from a top view. The side length SL is a subwavelength dimension. In some embodiments, the side length SL may range from 40 nm to 500 nm. Each of the plurality of protrusions 104B independently has a center C from a top view. In this embodiment, the center C is a point inside the square, through which any straight line also passes through two points on the edge of the square at the same distance from the center but on opposite sides. There is a pitch D between two adjacent centers C. The pitch D may range from 100 nm to 1000 nm.

Figure 7C:
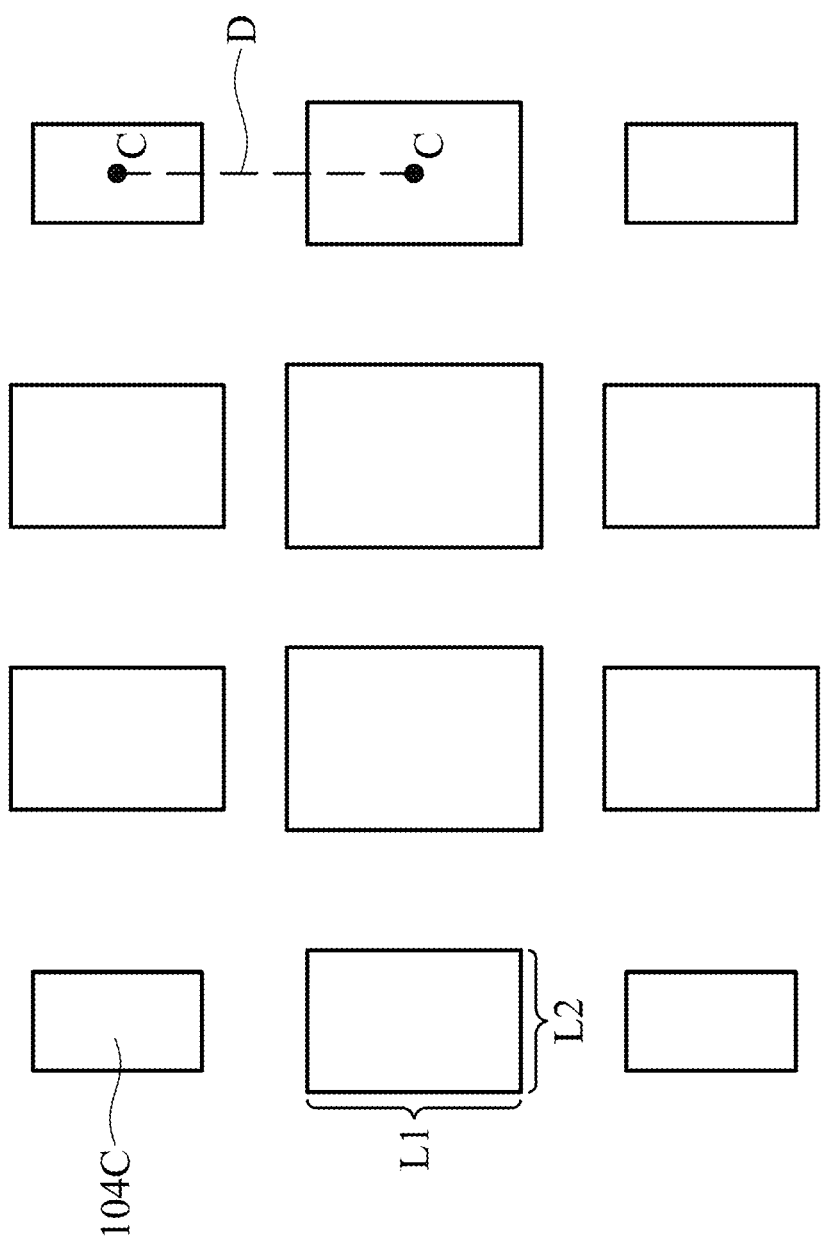
FIG. 7C illustrates a top view of a plurality of protrusions in accordance with some embodiments.

FIG. 7C, which illustrates a top view of a plurality of protrusions 104C in accordance with some embodiments, each of the plurality of protrusions 104C is a cuboid, which is a rectangle from a top view. Each of the plurality of protrusions 104C independently has a first length L1 and a second length L2 that is perpendicular to the first length L1 from a top view. The first length L1 and the second length L2 are subwavelength dimensions. In some embodiments, the first length L1 may range from 40 nm to 500 nm, and the second length L2 may range from 40 nm to 500 nm. Each of the plurality of protrusions 104C independently has a center C from a top view. In this embodiment, the center C is a point inside the rectangle, through which any straight line also passes through two points on the edge of the square at the same distance from the center but on opposite sides. There is a pitch D between two adjacent centers C. The pitch D may range from 100 nm to 1000 nm.

Figure 7D:
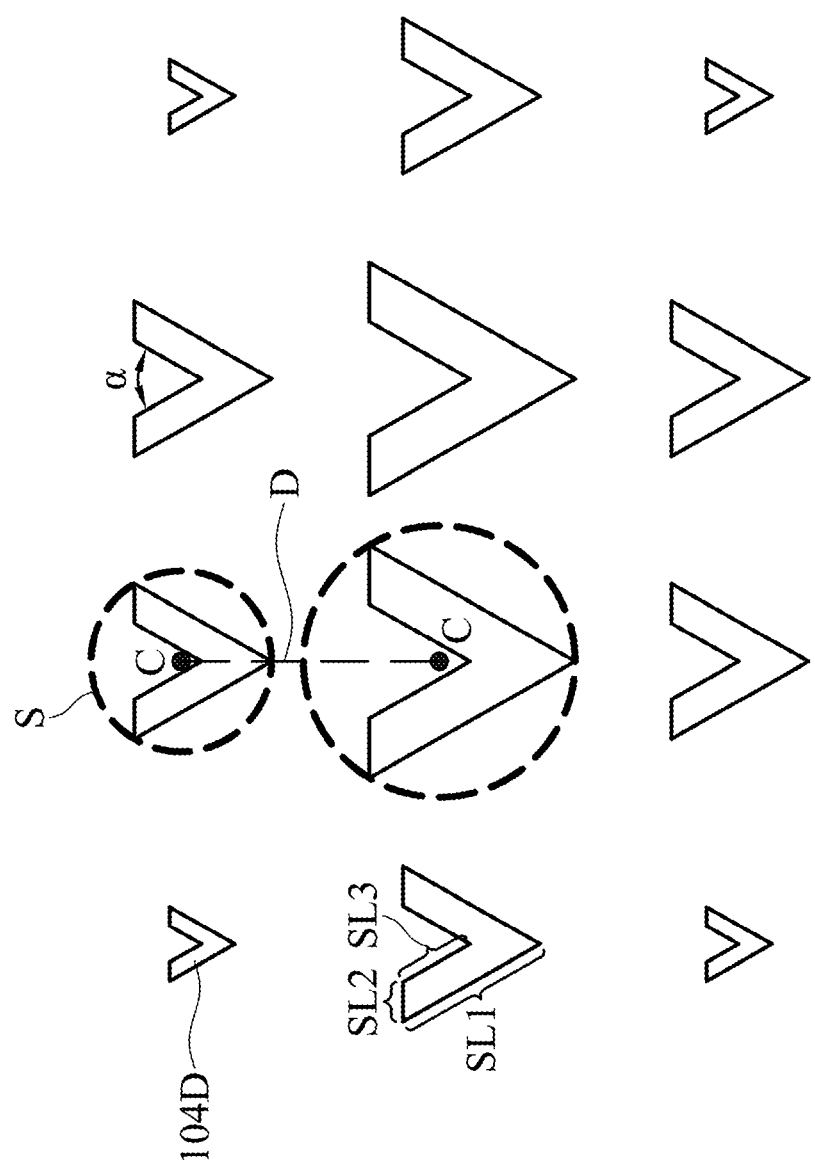
FIG. 7D illustrates a top view of a plurality of protrusions in accordance with some embodiments.

FIG. 7D, which illustrates a top view of a plurality of protrusions 104D in accordance with some embodiments, each of the plurality of protrusions 104D is a V-shaped antenna, which is a V-shape from a top view. Each of the plurality of protrusions 104D independently has a first side length SL1, a second side length SL2 and a third length SL3 from a top view. The first side length SL1 abuts the second side length SL2, and the second side length SL2 abuts the third side length SL3. In other words, the second side length SL2 connects the first side length SL1 and the third side length SL3. The first side length SL1 is parallel to the third side length SL3. In some embodiments, the angle between the second side length SL2 and the first side length SL1 is an acute angle, and the angle between the second side length SL2 and the third side length SL3 is an obtuse angle. Alternatively, the angle between the second side length SL2 and the first side length SL1 is an obtuse angle, and the angle between the second side length SL2 and the third side length SL3 is an acute angle. In other embodiments, the second side length SL2 is the shortest distance between the first side length SL1 and the third side length SL3.

The first side length SL1, the second side length SL2 and the third length SL3 are subwavelength dimensions. In some embodiments, the first side length SL1 may range from 40 nm to 500 nm, the second side length SL2 may range from 40 nm to 500 nm, and the third length SL3 may range from 40 nm to 500 nm. Each of the plurality of protrusions 104D independently has a circumcircle S. The circumcircle S is a circle that passes through all the vertices of the V-shaped antenna. In this embodiment, the center C is the center of a circumcircle S of the V-shaped antenna. The circumcircle S passes through all the vertices of the largest triangle of the V-shaped antenna. There is a pitch D between two adjacent centers C. The pitch D may range from 100 nm to 1000 nm. There is an angle α between the third side lengths SL3. The angle α ranges from 0 degrees to 180 degrees.

Figure 8:
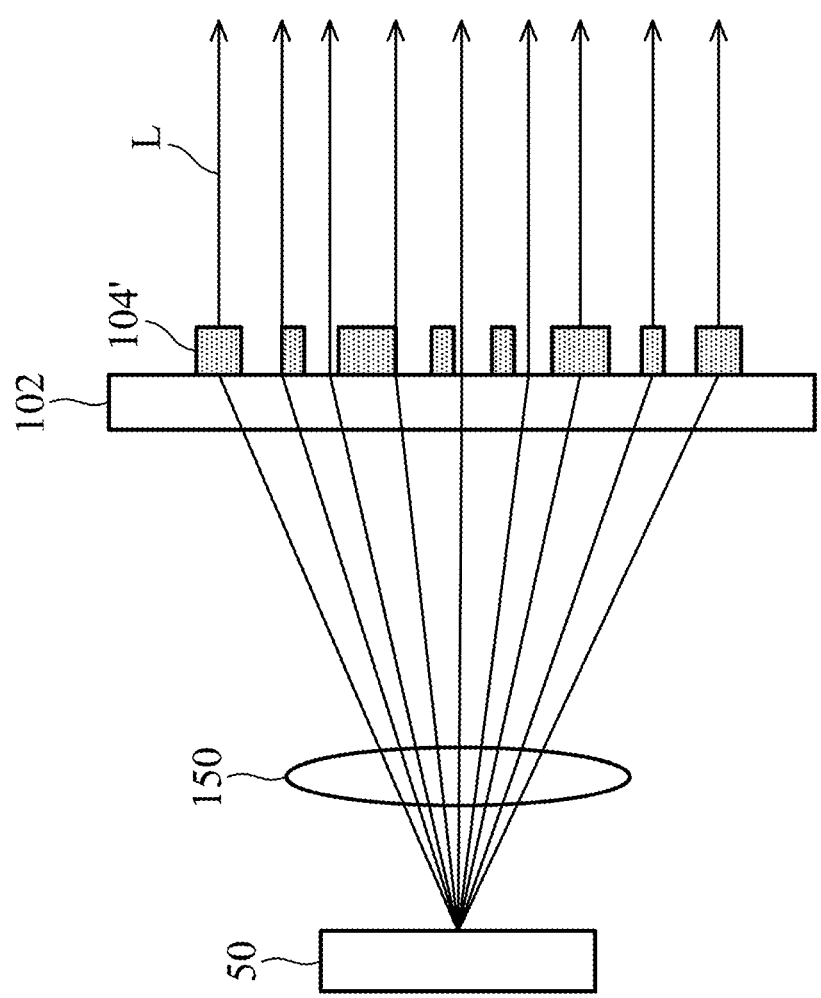
FIG. 8 illustrates a schematic view of a metasurface and a module lens in accordance with some embodiments.

FIG. 8 illustrates a schematic view of a metasurface and a module lens 150 in accordance with some embodiments. A module lens 150 is disposed between a light source 50 and the optical element 102 with a plurality of protrusions 104' (i.e., a metasurface). The light source 50 includes a visible light source or an infrared light source. The infrared light source emits light with a wavelength of 850 nm, 940 nm, 1350 nm or 1550 nm. The module lens 150 can focus the spray light L from the light source 50, so that most of the spray light L can irradiate the optical element 102 and can be collimated by the metasurface, as shown in FIG. 8. For example, the protrusions 104', as being a collimator, collimate the spray light L with an angle from zero degrees to 180 degrees into light with an angle of zero degrees.

Figure 9A:
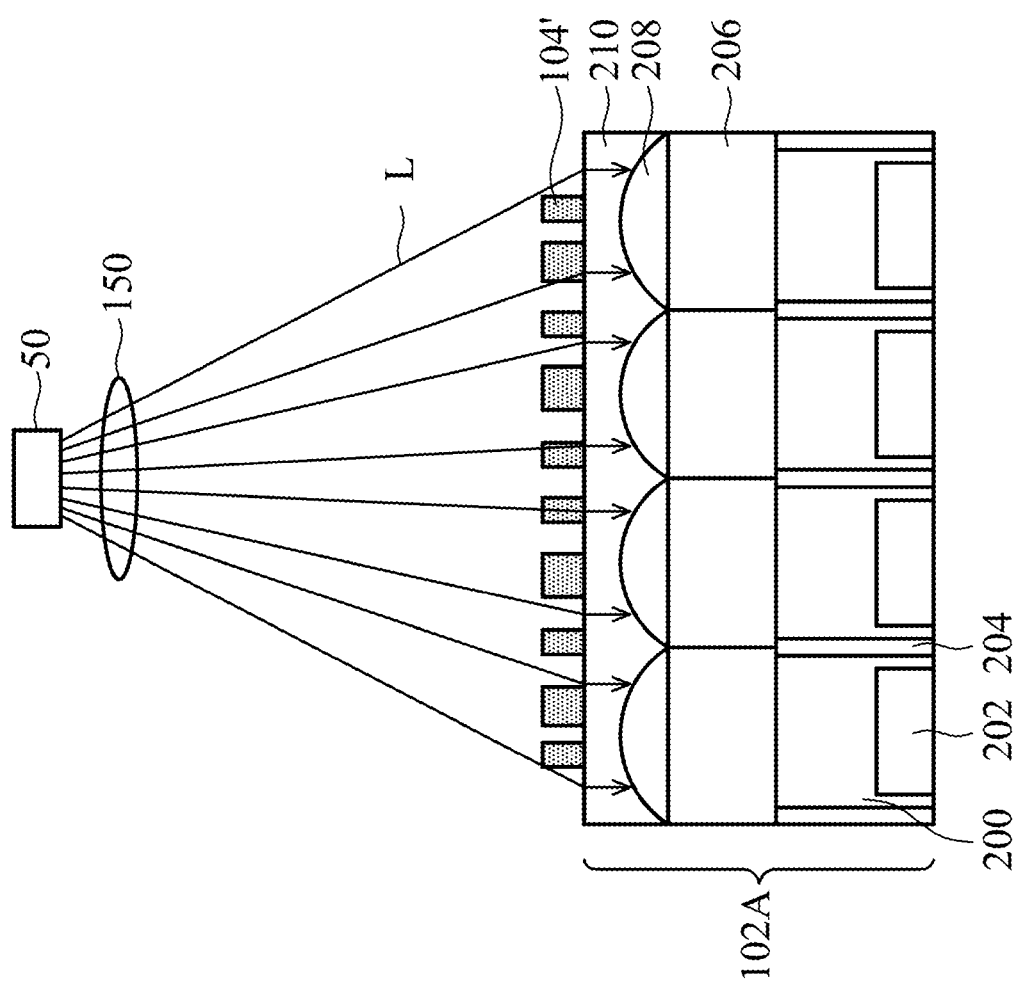
FIG. 9A illustrates a cross-sectional view of a CMOS image sensor with a metasurface in accordance with some embodiments.

FIG. 9A illustrates a cross-sectional view of a CMOS image sensor 102A with a metasurface in accordance with some embodiments. The CMOS image sensor 102A includes a substrate 200, a photodiode 202, a spacer 204, a filter layer 206, a microlens structure 208, a planarization layer 210 and a plurality of protrusions 104'.

The substrate 200 is a bulk semiconductor substrate, such as a semiconductor wafer. For example, the substrate 200 is a silicon wafer. The substrate 200 may include silicon or another elementary semiconductor material such as germanium. In some other embodiments, the substrate 200 includes a compound semiconductor. The compound semiconductor may include gallium arsenide, silicon carbide, indium arsenide, indium phosphide, another suitable material, or a combination thereof.

In some embodiments, the substrate 200 includes a semiconductor-on-insulator (SOI) substrate. The SOI substrate may be fabricated using a separation by implantation of oxygen (SIMOX) process, a wafer bonding process, another applicable method, or a combination thereof. In some embodiments, the substrate 200 is an un-doped substrate.

The photodiode 202 is disposed in the substrate 200. The spacer 204 is disposed between the photodiodes 202 to isolate the photodiodes 202. The filter layer 206 is disposed on the substrate 200. The filter layer 206 may be an organic filter or an inorganic filter. The filter layer 206 may include a plurality of sub-filters. Each of the sub-filters corresponds to one photodiode 202. The microlens structure 208 is disposed on the filter layer 206.

The planarization layer 210 is disposed on the microlens structure 208. The material of the planarization layer 210 may include, but is not limited to, an organic transparent material, a dielectric material, a semiconductor material such as silicon, any other suitable transparent material, or a combination thereof. In some embodiments of the present disclosure, the dielectric material includes silicon oxide, silicon nitride, silicon oxynitride, any other suitable dielectric material, or a combination thereof.

The plurality of protrusions 104' are disposed on the planarization layer 210. The module lens 150 is disposed between the light source 50 and the CMOS image sensor 102A. The module lens 150 can focus the spray light L from the light source 50, so that most of the spray light L can irradiate the CMOS image sensor 102A and can be collimated by the metasurface, as shown in FIG. 9A.

Figure 9B:
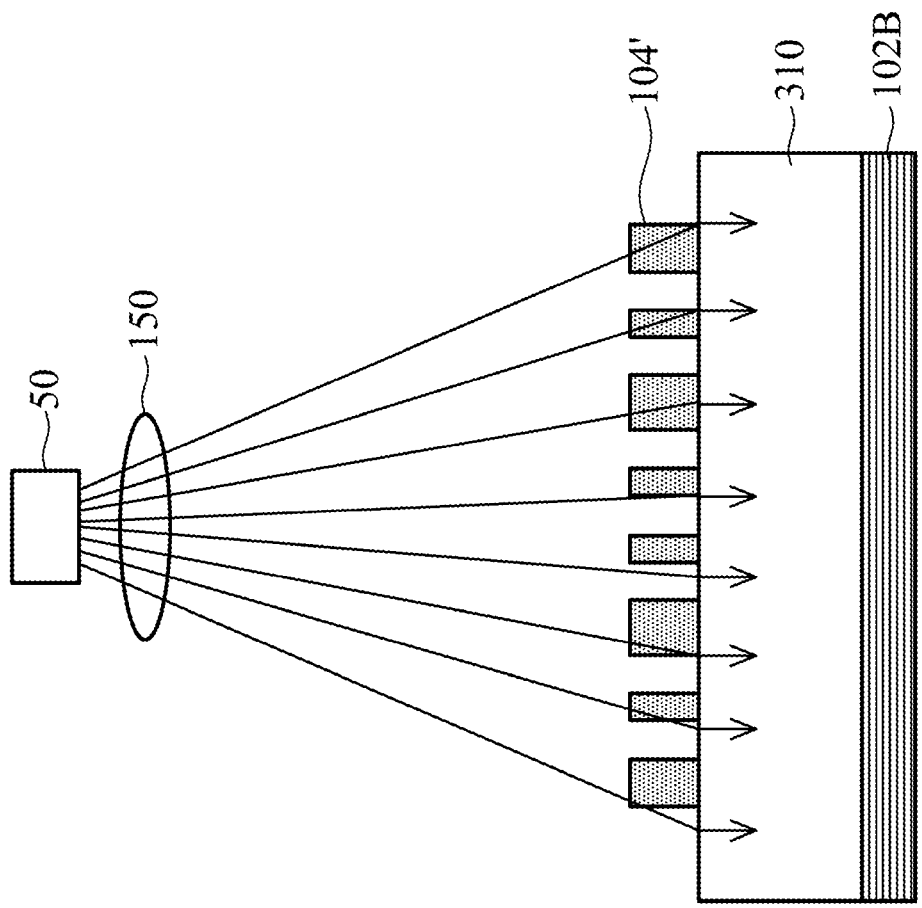
FIG. 9B illustrates a cross-sectional view of a multifilm with a metasurface in accordance with some embodiments.

FIG. 9B illustrates a cross-sectional view of a multifilm 102B with a metasurface in accordance with some embodiments. Note that the same or similar elements or layers are denoted by like reference numerals. In some embodiments, the same or similar elements or layers denoted by like reference numerals have the same meaning and will not be repeated, for the sake of brevity.

A planarization layer 310 is disposed on the multifilm 102B. The material of the planarization layer 310 may include, but is not limited to, an organic transparent material, a dielectric material, a semiconductor material such as silicon, any other suitable transparent material, or a combination thereof. In some embodiments of the present disclosure, the dielectric material includes silicon oxide, silicon nitride, silicon oxynitride, any other suitable dielectric material, or a combination thereof.

The plurality of protrusions 104' are disposed on the planarization layer 310. The module lens 150 is disposed between the light source 50 and the multifilm 102B. The module lens 150 can focus the spray light L from the light source 50, so that most of the spray light L can irradiate the multifilm 102B and can be collimated by the metasurface, as shown in FIG. 9B.

Figure 9C:
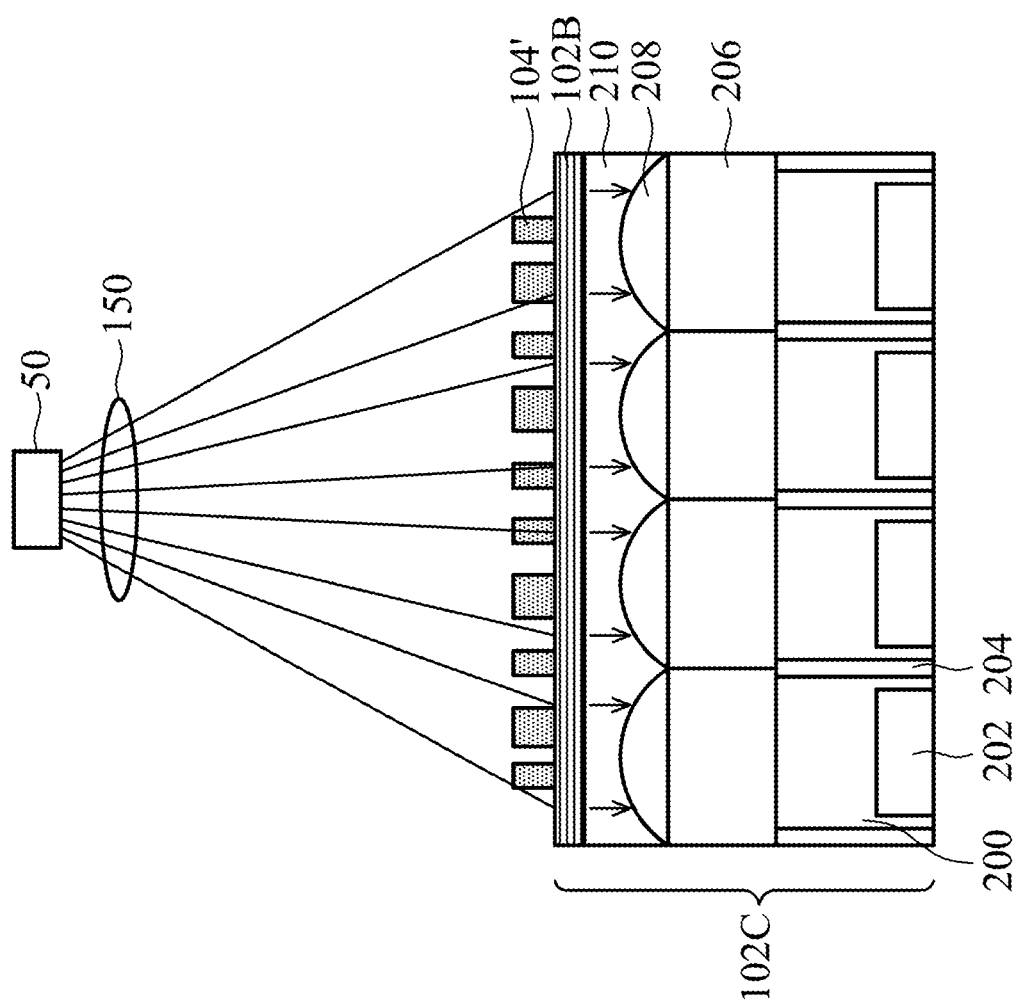
FIG. 9C illustrates a cross-sectional view of a CMOS image sensor with a multifilm and a metasurface in accordance with some embodiments.

FIG. 9C illustrates a cross-sectional view of a CMOS image sensor 102C with a multifilm 102B and a metasurface in accordance with some embodiments. Note that the same or similar elements or layers are denoted by like reference numerals. In some embodiments, the same or similar elements or layers denoted by like reference numerals have the same meaning and will not be repeated, for the sake of brevity.

The CMOS image sensor 102C includes the CMOS image sensor 102A and the multifilm 102B. The multifilm 102B is disposed on the CMOS image sensor 102A. The module lens 150 is disposed between the light source 50 and the CMOS image sensor 102C. The module lens 150 can focus the spray light L from the light source 50, so that most of the spray light L can irradiate the CMOS image sensor 102C and can be collimated by the metasurface, as shown in FIG. 9C.

Figure 9D:
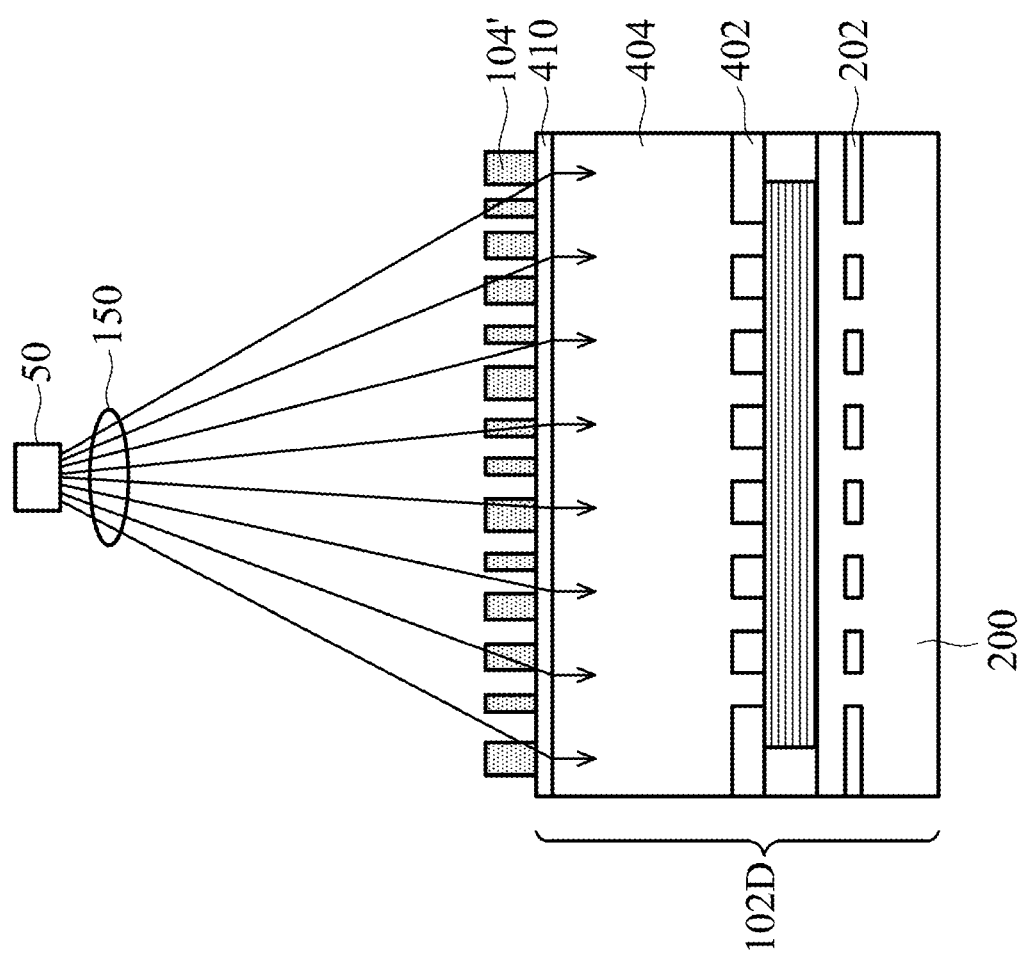
FIG. 9D illustrates a cross-sectional view of an optical fingerprint device with a metasurface in accordance with some embodiments.

FIG. 9D illustrates a cross-sectional view of a fingerprint sensor 102D with a metasurface in accordance with some embodiments. Note that the same or similar elements or layers are denoted by like reference numerals. In some embodiments, the same or similar elements or layers denoted by like reference numerals have the same meaning and will not be repeated, for the sake of brevity.

The fingerprint sensor 102D includes a substrate 200, a photodiode 202, an aperture structure 402, a transparent layer 404 and a planarization layer 410.

The aperture structure 402 includes a plurality of openings. The photodiode 202 is disposed according to the pattern of the aperture structure 402. The aperture structure 402 may include an opaque material. The opaque material may include Ag, Al, Au, Cu, Nb, Ni, Ti, W, an alloy thereof or a hybrid material thereof.

The transparent layer 404 is disposed on the aperture structure 402. A portion of the transparent layer 404 is disposed in the openings of the aperture structure 402. The planarization layer 410 is disposed on the transparent layer 404. The materials of the transparent layer 404 and the planarization layer 410 are similar to that of the planarization layer 310.

The module lens 150 is disposed between the light source 50 and the optical fingerprint device 102D. The module lens 150 can focus the spray light L from the light source 50, so that most of the spray light L can irradiate the optical fingerprint device 102D and can be collimated by the metasurface, as shown in FIG. 9D.

Compared to the prior art, the optical structure provided by the present invention have one or more of the following advantages:

(1) Crosstalk may be avoided by disposing a metasurface having a plurality of protrusions, thereby enhancing spatial resolution, enhancing overall sensitivity, improving signal-to-noise ratio and avoiding color-mixing, which leads to better image quality. In addition, the isolation wall between the photodiodes can be omitted, thereby reducing the volume of the device.

(2) The blue-shift issue can also be addressed because the optical multifilm is not irradiated at a large angle.

(3) The fingerprint sensors can also produce higher-resolution images at a higher contrast.

Although some embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. An optical structure, comprising:
   an optical element having a planarized top surface; and
   a plurality of protrusions disposed on the planarized top surface, wherein each of the plurality of protrusions independently has a size in subwavelength dimensions,
   wherein the plurality of protrusions comprise V-antennas having a V-shape from a top view, and
   wherein each of the plurality of protrusions has a first side length, a second side length and a third side length from a top view, the second side length connects the first side length and the third side length, the first side length is parallel to the third side length, the second side length is the shortest distance between the first side length and the third side length, the first side length is from 40 nm to 500 nm, the second side length is from 40 nm to 500 nm, and the third side length is from 40 nm to 500 nm.

2. The optical structure as claimed in claim 1, wherein the plurality of protrusions have a pitch ranging from 100 nm to 1000 nm.

3. The optical structure as claimed in claim 1, wherein the plurality of protrusions have a size distribution that controls a phase of an incident light to be between 0 and $2\pi$.

4. The optical structure as claimed in claim 1, wherein the plurality of protrusions collimate an incident light with an angle from zero degrees to 180 degrees into light with an angle of zero degrees.

5. The optical structure as claimed in claim 1, wherein a material of the plurality of protrusions comprises $TiO_2$, SiN, $SiO_2$, SiH or a combination thereof.

6. The optical structure as claimed in claim 1, wherein the optical element further comprises an optical multifilm.

7. A method of fabricating an optical structure, comprising:
   providing an optical element having a planarized top surface; and
   forming a plurality of protrusions on the planarized top surface, wherein each of the plurality of protrusions independently has a size in subwavelength dimensions,
   wherein the plurality of protrusions comprise V-antennas having a V-shape from a top view, and
   wherein each of the plurality of protrusions has a first side length, a second side length and a third length from a top view, the second side length connects the first side length and the third side side length, the first side length is parallel to the third side length, the second side length is the shortest distance between the first side length and the third side length, the first side length is from 40 nm to 500 nm, the second side length is from 40 nm to 500 nm, and the third side length is from 40 nm to 500 nm.

8. The method as claimed in claim 7, wherein the step of forming a plurality of protrusions on the planarized top surface comprises:
   forming a material layer on the planarized top surface;
   forming a resin layer on the material layer;
   patterning the resin layer using a nanoimprint process; and
   etching the material layer to form the plurality of protrusions.

9. The method as claimed in claim 7, wherein the step of forming a plurality of protrusions on the planarization layer comprises:
   forming a material layer on the planarized top surface;
   forming a photoresist layer on the material layer;
   patterning the photoresist layer using a lithography process; and
   etching the material layer to form the protrusions.

10. The method as claimed in claim 7, wherein the plurality of protrusions have a pitch ranging from 100 nm to 1000 nm.

11. The method as claimed in claim 7, wherein a material of the plurality of protrusions comprises $TiO_2$, SiN, $SiO_2$, SiH or a combination thereof.

12. The method as claimed in claim 7, wherein the plurality of protrusions have a size distribution that controls a phase of an incident light to be between 0 and $2\pi$, and collimate an incident light with an angle from zero degrees to 180 degrees into light with an angle of zero degrees.

13. An optical system, comprising:
a sensing sensor;
an optical element disposed above the sensing sensor, the optical element having a planarized top surface; and
a plurality of protrusions disposed on the planarized top surface, wherein each of the plurality of protrusions independently has a size in subwavelength dimensions,
wherein the plurality of protrusions comprise V-antennas having a V-shape from a top view, and
wherein each of the plurality of protrusions has a first side length, a second side length and a third side length from a top view, the second side length connects the first side length and the third side length, the first side length is parallel to the third side length, the second side length is the shortest distance between the first side length and the third side length, the first side length is from 40 nm to 500 nm, the second side length is from 40 nm to 500 nm, and the third side length is from 40 nm to 500 nm.

14. The optical system as claimed in claim 13, wherein the sensing sensor comprises a CMOS image sensor or a fingerprint sensor.

15. The optical system as claimed in claim 13, further comprising a light source disposed above the optical element, wherein the light source comprises a visible light source or an infrared light source.

16. The optical system as claimed in claim 15, wherein the infrared light source emits light with a wavelength of 850 nm, 940 nm, 1,350 nm or 1,550 nm.

* * * * *